US009058959B2

(12) United States Patent
Kawanami et al.

(10) Patent No.: US 9,058,959 B2
(45) Date of Patent: Jun. 16, 2015

(54) SCANNING ION MICROSCOPE AND SECONDARY PARTICLE CONTROL METHOD

(71) Applicant: Hitachi High-Technologies Corporation, Minato-ku, Tokyo (JP)

(72) Inventors: Yoshimi Kawanami, Tokyo (JP); Yoichi Ose, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/363,252

(22) PCT Filed: Nov. 8, 2012

(86) PCT No.: PCT/JP2012/078925
§ 371 (c)(1),
(2) Date: Jun. 5, 2014

(87) PCT Pub. No.: WO2013/084651
PCT Pub. Date: Jun. 13, 2013

(65) Prior Publication Data
US 2015/0048247 A1 Feb. 19, 2015

(30) Foreign Application Priority Data
Dec. 6, 2011 (JP) ................................. 2011-266616

(51) Int. Cl.
*H01J 37/26* (2006.01)
*H01J 37/28* (2006.01)
*H01J 37/244* (2006.01)
(Continued)

(52) U.S. Cl.
CPC ............... *H01J 37/28* (2013.01); *H01J 37/265* (2013.01); *H01J 37/244* (2013.01); *H01J 37/222* (2013.01); *H01J 37/20* (2013.01); *H01J 2237/2806* (2013.01); *H01J 2237/2807* (2013.01); *H01J 2237/0473* (2013.01); *H01J 2237/0807* (2013.01)

(58) Field of Classification Search
CPC ................ G01N 2001/028; H01J 2237/31732; H01J 2237/31749; H01J 37/20; H01J 37/302
USPC .......... 250/311, 306, 307, 310, 492.2, 442.11
See application file for complete search history.

(56) References Cited

U.S. PATENT DOCUMENTS 6,538,254 B1 * 3/2003 Tomimatsu et al. ..... 250/442.11
2003/0183776 A1 * 10/2003 Tomimatsu et al. ..... 250/442.11
(Continued)

FOREIGN PATENT DOCUMENTS

JP     61-034844 A     2/1986
JP     62-298708 A     12/1987
(Continued)

*Primary Examiner* — Nikita Wells
(74) *Attorney, Agent, or Firm* — Miles & Stockbridge P.C.

(57) ABSTRACT

The present invention is provided to enable a detailed inspection of a specimen and preventing a distortion of an observation image even when a specimen containing an insulating material is partially charged. For a scanning ion microscope utilizing a gas field ionization ion source, a thin film is disposed between an ion optical system and a specimen, and an ion beam is applied to and transmitted through this thin film in order to focus a neutralized beam on the specimen. Furthermore, an electrode for regulating secondary electrons discharged from this thin film is provided in order to eliminate mixing of noises into an observation image.

12 Claims, 9 Drawing Sheets

(51) Int. Cl.
*H01J 37/22* (2006.01)
*H01J 37/20* (2006.01)

(56) References Cited

U.S. PATENT DOCUMENTS

| | | | |
|---|---|---|---|
| 2006/0231776 A1* | 10/2006 | Tomimatsu et al. | 250/492.21 |
| 2007/0138388 A1 | 6/2007 | Ward et al. | |
| 2007/0158555 A1 | 7/2007 | Ward et al. | |
| 2007/0158556 A1 | 7/2007 | Ward et al. | |
| 2007/0158557 A1 | 7/2007 | Ward et al. | |
| 2007/0158558 A1 | 7/2007 | Ward et al. | |
| 2007/0158580 A1 | 7/2007 | Ward et al. | |
| 2007/0158581 A1 | 7/2007 | Ward et al. | |
| 2007/0158582 A1 | 7/2007 | Ward et al. | |
| 2007/0187621 A1 | 8/2007 | Ward et al. | |
| 2007/0194226 A1 | 8/2007 | Ward et al. | |
| 2007/0194251 A1 | 8/2007 | Ward et al. | |
| 2007/0205375 A1 | 9/2007 | Ward et al. | |
| 2007/0210250 A1 | 9/2007 | Ward et al. | |
| 2007/0210251 A1 | 9/2007 | Ward et al. | |
| 2007/0215802 A1 | 9/2007 | Ward et al. | |
| 2007/0221843 A1 | 9/2007 | Ward et al. | |
| 2007/0227883 A1 | 10/2007 | Ward et al. | |
| 2007/0228287 A1 | 10/2007 | Ward et al. | |
| 2008/0111069 A1 | 5/2008 | Notte | |
| 2008/0217555 A1 | 9/2008 | Ward et al. | |
| 2009/0114840 A1 | 5/2009 | Ward et al. | |
| 2009/0179161 A1 | 7/2009 | Ward et al. | |
| 2014/0299768 A1* | 10/2014 | Shichi et al. | 250/310 |

FOREIGN PATENT DOCUMENTS

| | | |
|---|---|---|
| JP | 05-234552 A | 9/1993 |
| JP | 07-192669 A | 7/1995 |
| JP | 08-138617 A | 5/1996 |
| JP | 08-240542 A | 9/1996 |
| JP | 09-033462 A | 2/1997 |
| JP | 10-064467 A | 3/1998 |
| JP | 11-154479 A | 6/1999 |
| JP | 2002-134060 A | 5/2002 |
| JP | 2008-004569 A | 1/2008 |
| JP | 2008-185336 A | 8/2008 |
| JP | 2009-517846 A | 4/2009 |
| JP | 2010-203805 A | 9/2010 |
| JP | 2011-095154 A | 5/2011 |
| JP | 2011-124162 A | 6/2011 |
| JP | 2011-134590 A | 7/2011 |
| WO | WO 2007/067296 A2 | 6/2007 |
| WO | WO 2007/067310 A2 | 6/2007 |
| WO | WO 2007/067311 A2 | 6/2007 |
| WO | WO 2007/067313 A2 | 6/2007 |
| WO | WO 2007/067314 A2 | 6/2007 |
| WO | WO 2007/067315 A2 | 6/2007 |
| WO | WO 2007/067316 A2 | 6/2007 |
| WO | WO 2007/067317 A2 | 6/2007 |
| WO | WO 2007/067318 A2 | 6/2007 |
| WO | WO 2007/067328 A2 | 6/2007 |
| WO | WO 2007/109666 A2 | 9/2007 |
| WO | WO 2009/035841 A1 | 3/2009 |

* cited by examiner

SCANNING ION MICROSCOPE AND SECONDARY PARTICLE CONTROL METHOD

FIELD OF THE INVENTION

The present invention relates to a scanning ion microscope that can form a specimen image by scanning with uncharged particles and a secondary particle control method.

BACKGROUND ART

Patent Document 1 and Patent Document 2 disclose focused ion beam (FIB) devices that have gas field ionization ion source (GFIS) and use gas ions such as hydrogen (H2), helium (He), and neon (Ne). Such gas focused ion beams (gas FIB) has an advantageous effect in that they do not bring Ga contamination to the specimen as in a gallium (Ga: metal) focused ion beam (Ga-FIB) from a liquid metal ion source (LMIS), which is used often nowadays.

In addition, the energy width of the gas ions extracted from GFIS is narrow and the size of an ion generation source is small in GFIS, and thus GFIS can form minute beams than Ga-FIB.

Such gas FIB devices are used as a scanning ion microscope having a high resolution. That is, an image of the specimen is formed by detecting secondary particles emitted from the specimen, synchronizing with the scanning the specimen with the ions.

Patent Document 3 discloses a pattern inspection device that use an ion beam, wherein the ion beam that has converged and scanned is neutralized and irradiates onto the specimen. The neutralization is performed by an electron emission source (grid etc. to which negative voltage is applied) which is provided to cross the ion beam.

Patent Document 4 discloses a surface analysis device that uses an ion beam, wherein the ion beam is charge-neutralized for irradiation of the specimen. The charge-neutralizing means is provided by exchanging charges in gas (and in a capillary). Here, in order to make energy of uncharged particle beams uniform and to remove particles other than uncharged particles, there are further provided a means for removing multivalent ions as pre-treatment and a means for removing charged particles as post-treatment.

Patent Document 5 discloses an analysis apparatus that uses ion beams of high energy (MeV level), wherein ion beams led from vacuum are applied to the specimen in atmospheric pressure such that the ion beams are transmitted through an exit window (pressure bulkhead). The pressure bulkhead is formed by attaching a gold thin film on a metal net-structured object. Here, since the net-structured object partially supports the pressure difference between inside and outside of the pressure bulkhead, the gold thin film through which the ion beams are transmitted can be made relatively thin. Thereby, analysis accuracy has improved. Patent Documents 6, 7 and 8 disclose techniques similar to those in Patent Document 5. Here, for example, methods for cooling the pressure bulkhead, methods for monitoring a beam amount, and methods for reinforcing the pressure bulkhead are disclosed.

Patent Document 9 describes an arrangement of a film that can transmit ion beams on an ion beam path in order to remove contamination of low energy that comes from, for example, inner walls, in an ion implantation device. The film is a high polymer thin film. Degradation is prevented by exchanging the film once in every fixed service period.

PRIOR TECHNICAL DOCUMENTS

Patent Document

Patent Document 1:
  Japan Patent Application Publication JP 07-192669 A
Patent Document 2:
  Japan International Patent Application Publication JP 2009-517846 W
Patent Document 3:
  Japan Patent Application Publication JP 62-298708 A
Patent Document 4:
  Japan Patent Application Publication JP 2008-185336 A
Patent Document 5:
  Japan Patent Application Publication JP 08-240542 A
Patent Document 6:
  Japan Patent Application Publication JP 09-033462 A
Patent Document 7:
  Japan Patent Application Publication JP 2010-203805 A
Patent Document 8:
  Japan Patent Application Publication JP 2011-095154 A
Patent Document 9:
  Japan Patent Application Publication JP 2002-134060 A

SUMMARY OF THE INVENTION

Object of the Invention

In a case where a specimen containing an insulator is observed with a scanning ion microscope, there is an issue that an image of the specimen is distorted with respect to an actual image as a result of the path of the ion beam being locally bent by partial electrification of the specimen. This cannot be completely solved by reducing electrification on the specimen. The best solution is to neutralize the ion beam itself (i.e., remove electric charge).

As described above, the ion beam neutralization method described in Patent Document 3 is described as having a grid structure in which negative voltage applied so as to intersect the flight path of the ion beam is applied.

Patent Document 4 needs to add, for example, a means for removing remaining ions to the latter stage. Such means serves as a big hindrance when converging ion beams minutely.

It should be noted that the conventional thin film utilizing methods described in Patent Documents 6, 7 and 8 do not describe whether the transmitted beam has electric charge. However, since energy of ions is large, existence of electric charge does not influence the measurement and thus it is presumed that the neutralization ratio itself is low. Furthermore, since the conventional thin film utilizing method described in Patent Document 9 does not care about convergence characteristics of the beam, existence of electric charge or secondary electrons in the transmitted beam has not been paid attention.

The present invention has been achieved in view of the above-described issues and an object of the present invention is to provide a scanning ion microscope that can observe a specimen minutely and prevent distortion of an observation image even if a specimen containing an insulator is charged partially and a secondary particle control method.

Means for Solving the Problem

In order to achieve the above-described object, the scanning ion microscope according to the present invention uses a gas field ionization ion source and arranges a thin film onto which ions are irradiated between a specimen and an ion optical system which makes ions converge and deflect onto the specimen. This thin film is supported by an electrically-conductive support member. There is provided a means for controlling an electric potential of the support member Furthermore, there are provided an electrode having an opening between the thin film and the specimen, and a means for controlling the electric potential of the electrode (e.g., power source 83).

The present invention utilizes that most of the ions applied to the thin film are neutralized after going through a first layer on the surface of the thin film, and are emitted as uncharged particles when transmitting through the thin film. In addition, ions applied to the thin film also emit secondary electrons. There is provided a means for controlling the secondary electrons emitted from the thin film appropriately for preventing a part of the secondary electrons penetrating through the thin film (e.g., power source 84).

EFFECT OF THE INVENTION

According to the present invention, it is possible to observe a specimen minutely and prevent distortion of an observation image even if a specimen containing insulators is charged partially.

DETAILED DESCRIPTION OF THE INVENTION

Embodiments of scanning ion microscopes according to the present invention will be described in detail with reference to the drawings.

<First Embodiment>

Figure 1:
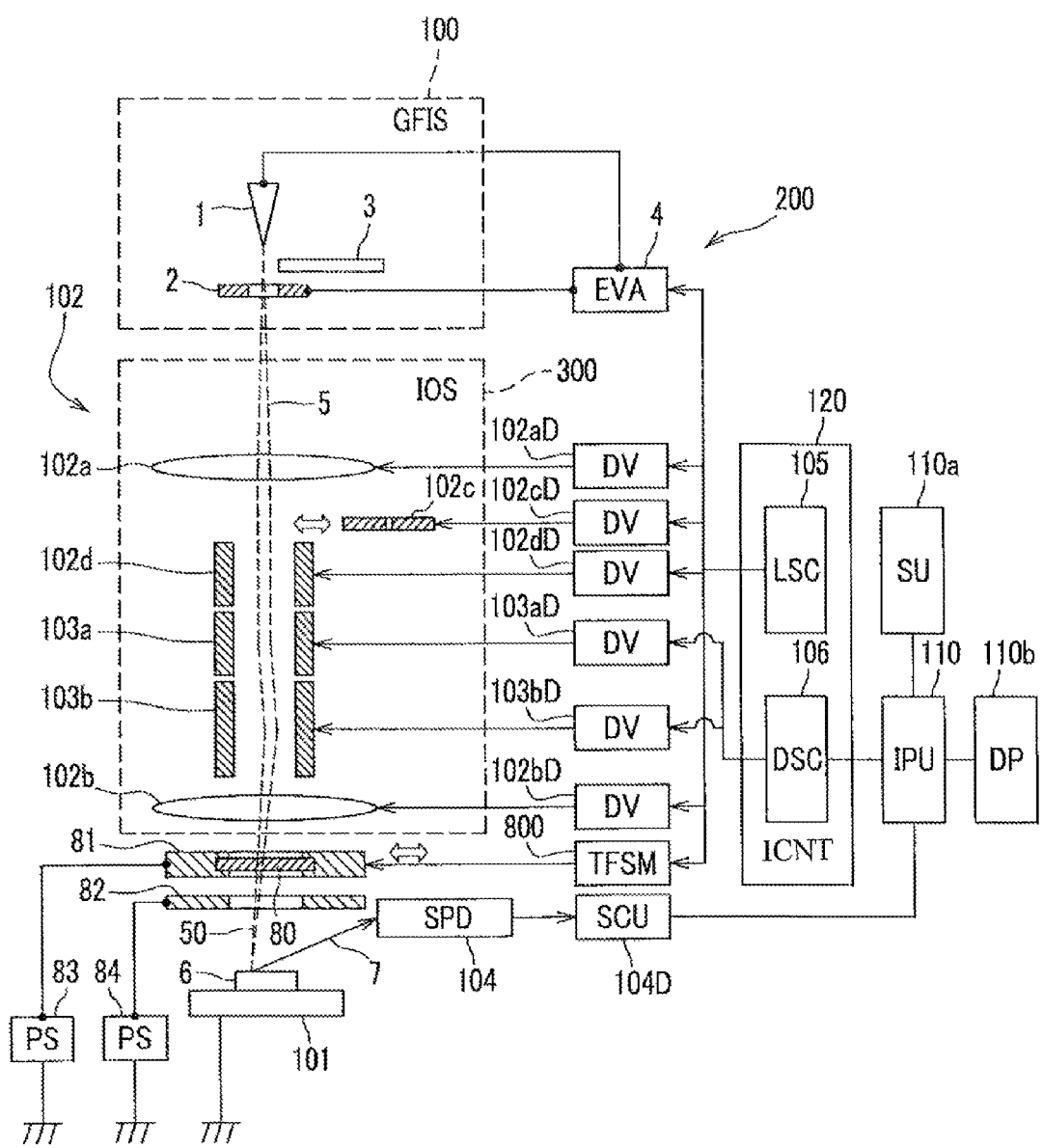
FIG. 1 shows an entire configuration of a scanning ion microscope according to a first embodiment of the present invention.

FIG. 1 shows an entire configuration of a scanning ion microscope according to the present embodiment. The scanning ion microscope 200 according to the present embodiment is configured by incorporating a gas field ionization ion source (GFIS) 100 utilizing helium (He) into a focused ion beam (FIB) device produced for a conventional gallium-liquid metal ion source (Ga-LMIS) instead of the Ga-LMIS.

In FIG. 1, a scanning ion microscope 200 has a configuration in which a helium (He) ion beam 5 emitted from a GFIS 100 enter into an ion optical system 300 (ion optical series system) which cause the ion beams 5 to converge by the ion optical system 300, and thus irradiates a specimen 6 placed on a specimen stage 101 with the ion beams 5. Acceleration voltage of ions is 30 kV.

The GFIS 100 includes: an emitter tip 1; an extraction electrode 2; and a gas discharge outlet 3 of gas supplying piping, which supplies gas for ionization to an apex of the emitter tip. The emitter tip 1 ionizes gas that is supplied from the gas discharge outlet 3 and resides at the apex of the tip with a high voltage (the emitter tip 1 side is positive and the extraction electrode 2 side is negative) applied from the extraction voltage application unit 4 between the emitter tip 1 and the extraction electrode 2. The extraction electrode 2 extracts ions generated by the emitter tip 1 and emits the ions as an ion beam 5 to the ion optical system 300.

The ion optical system 300 includes: a lens system 102 (lens series system) containing electrostatic lenses 102*a*, 102*b*, a beam limiting aperture 102*c*, and an aligner 102*d*; and a deflector system 103 (deflector series system) including deflectors 103*a*, 103*b*. The ion beam 5 that has entered the ion optical system 300 converges with the electrostatic lenses 102*a*, 102*b* in the ion optical system 300 and is applied to the specimen 6. At this time, the position where the ion beam 5 is irradiated onto the specimen 6 is adjusted by deflecting the ion beam 5 with the deflectors 103*a*, 103*b*.

At this time, the lens system 102 including the electrostatic lenses 102*a*, 102*b*, the beam limiting aperture 102*c*, and the aligner 102*d* is controlled by a lens system controller 105 by controlling the drive of the corresponding drivers (DV) 102*a*D-102*d*D. In addition, the lens system controller 105 also controls the ion beam 5 emitted by the ion optical system 300 by controlling the drive of the extraction voltage application unit 4. Meanwhile, the deflector system 103 containing the deflectors 103*a*, 103*b* is controlled by control of the corresponding drivers (DV) 103*a*D, 103*b*D by the deflector system controller 106.

An ion controller 120 for controlling the ion optical system 300 is configured with the lens system controller 105 and the deflector system controller 106 together with a plurality of drivers.

Secondary electrons 7 generated from the specimen 6 as a result of the above-described irradiation with the ion beam 5 are detected by a secondary particle detector 104 and are converted into digital signals through an A/D signal conversion unit 104D. Thereafter, the image processing unit 110 forms a secondary electron observation image (image) in which the signal intensity of the digital signal is associated with the deflection intensity, and the image is displayed onto the display unit 110*b*. An image formed by the image processing unit 110 is stored in a storage unit 110*a* (image memory). The image thus stored is used for image operations and image display. The user can specify a position to which the ion beam 5 is applied on the screen of the display unit 110*b* while looking into the secondary electron observation image displayed on the display unit 110*b*.

In FIG. 1, an operation to control the entirety of the lens system controller 105, the deflector system controller 106, and the image processing unit 110 is omitted.

A first feature of the present embodiment is in addition to a fundamental configuration of the scanning ion microscopes a thin film 80 is disposed between the ion optical system 300 and the specimen 6 to neutralize the charge of the ion beam 5 to convert the ion beam 5 into an uncharged particle beam 50 for irradiating the specimen.

That is, the present embodiment maintains characteristics of a microscope since the thin film 80 serves as a neutralization means of the ion beam 5 and does not change at all the advancing direction of ions in the ion beam 5 that converge and scan in the ion optical system 300. The secondary electron image of the specimen 6 is substantially unchanged from that in a case where there is no thin film 80. However, since kinetic energy of the ion decreases slightly, brightness of the secondary electron image is reduced slightly. In addition, since a small amount of component that has changed in the advancing direction as a result of a scatter in the thin film 80 is mixed also, a small amount of background noise is produced in the secondary electron image.

It should be noted that since conventional neutralization means of an ion beam, for example, methods that use charge exchange in gas or capillary penetration, not only have low neutralization ratio but also the advancing direction of the ion beams spreads by experiencing a lot of dispersion, such means cannot be used for the purpose of the microscope according to the present invention.

Here, in order for the thin film 80 to function as a neutralization means of an ion beam, it is necessary to meet the following two conditions. A first condition is that an acceleration voltage of the ion beam 5 (which represents kinetic energy upon entering into the thin film 80) should be in a low speed to medium speed region, which is from several kV to about 100 kV.

When an ion subject to the acceleration voltage in a range from a low speed to medium speed enters into a solid, the speed of the entering ion is overwhelmingly lower than a speed of an electrically-conductive electron in a solid. Accordingly, an electric field produced by the ion is immediately shielded by electrically-conductive electrons. That is, the ion is neutralized. This has been confirmed experimentally also by checking ions that are scattered on a surface of a solid. The ion scattered in a first atomic layer of a surface of a solid comes out mostly unchanged as an ion. The ion scattered in a second atomic layer of a surface of a solid comes out mostly being neutralized. It should be noted that it is possible to provide distinction as to from what depth and by what atom the reflected ions and uncharged particles are scattered according to energy losses by energy discrimination of the reflected ions and uncharged particles with, for example, a semiconductor detector. In addition, the measurement may be performed by removing only ions with an electric field.

Figure 9:
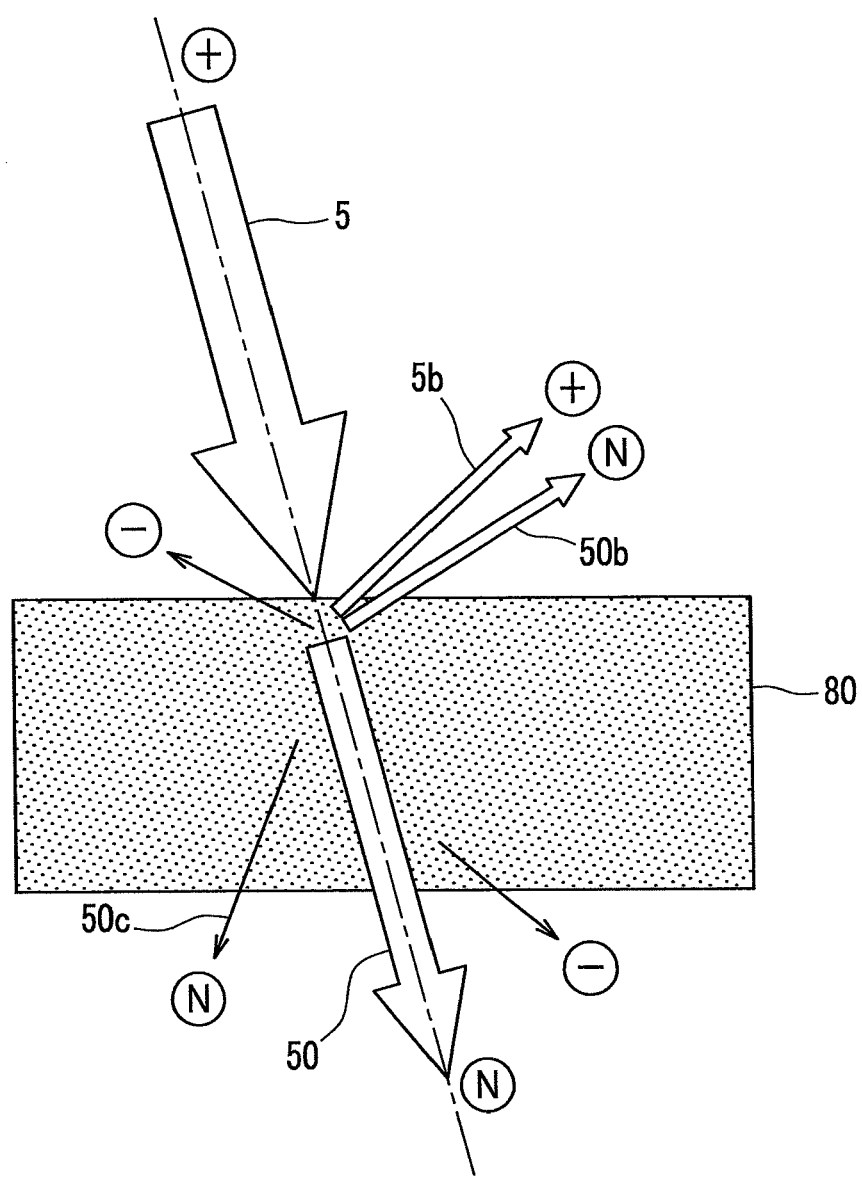
FIG. 9 shows a diagram illustrating a situation of neutralization of ion beams of the present invention.

FIG. 9 shows a diagram illustrating a situation of neutralization of an ion beam in the present invention. The above situation of neutralization of the ion beam will be described now with reference to FIG. 9. In this diagram, "+" represents an ion, "N" represents an uncharged particle, and "−" represents an electron. A part of ions in the ion beam 5 that enters the thin film 80 are scattered at the surface. An ion scattered in the first atomic layer on the surface is emitted as an ion 5b, and an ion scattered in the second atomic layer in the surface is emitted as an uncharged particle 50b. If an ion is scattered in a location deeper than the second atomic layer, the ion hardly comes out from the thin film 80 but a part of the ions transmit through the thin film 80 as uncharged particles 50c. Most ions in the ion beam 5 transmit through the thin film 80 as an uncharged particle beam 50 without changing the direction. Excited secondary electrons are emitted from the surface which the ion beam 5 enters and the surface the uncharged particle beam 50 is emitted. It should be noted that the scattered ions, uncharged particles, and secondary electrons are emitted with a broad angle distribution. In addition, re-ionization takes place rarely when the uncharged particle beam 50 is emitted. However, it is not illustrated since the probability is very low.

It should be noted that an ion beam having acceleration voltage of MV order, such as those used in RBS or PIXE, transmits through a thin film as ions with no change causing almost no interactions when entering into the thin film, and such an ion beam cannot be used for the present invention.

Another condition is that the thickness of the thin film 80 should be sufficiently thin as compared to a flying distance ("range") of the ion beam 5.

Near the "range", the probability that an ion that has entered in to a solid scatters increases and the direction of the ions is broadened rapidly, and the ion stops near the "range". At a distance sufficiently shorter than the range, the ion loses kinetic energy slightly as a result of inelastic scattering (dependent on the distance from the incident location) but the advancing direction is not changed. However, some ions change the advancing direction in a rare case as a result of elastic scattering. Such "range" varies with what the ion is (dependent on its mass), kinetic energy of the ion, and what the solid is (dependent on its element and density), and thus it is difficult to express the above condition with a short expression using an observable matter.

As to other expressions, it is considered that it is appropriate to express thickness of the thin film 80 with a transmission factor of the ion beam 5. Fundamentally, the thickness of the thin film 80 is set such that 50% or more of ions in the ion beam 5 transmits through the thin film 80. This condition is a practical limit. If this condition is not met, there are produced a lot of beams that have changed the direction as a result of the scattering in the thin film, thus causing a lot of background noise in the secondary electron image, for example. More preferably, it is possible to obtain an image of a specimen in which background noise is reduced by setting the thickness of the thin film 80 such that 90% or more of ions in the ion beam 5 transmit the thin film 80. It should be noted that the neutralization ratio is reduced when the thickness of the thin film 80 is smaller than a two atom layer, and thus such a case is not suitable for the present invention.

Here, ionic species of the ion beam 5 is a monovalent helium ion in the present embodiment. Fundamentally, any ionic species can be used as long as the relation between the energy of the ion beam and the thickness of the thin film meets the above-described conditions (i.e., a multivalent ion or heavier ionic species is sufficient). Therefore, ion sources such as a plasma ion source, a liquid metal ion source, and an ionic liquid ion source can be used for the ion source instead of a gas field ionization ion source.

The reason why a helium ion is chosen in the present embodiment is that, since its normal state is gas, the ions come out from the thin film as gas when a small portion of the ions remain inside the thin film, and thus it is not likely to damage the thin film. If the ions are not gas, it is more likely that the ions remain and are accumulated in the thin film, changing the characteristics of the thin film. In this regard, neon ions and argon ions, which are gas, may also be used. In addition, another reason for selecting helium ions is because their transmission capability is high with respect to thin films that are currently available. In this regard, hydrogen ions having lighter mass may also be used. As to a heavy ion, it becomes more likely that thin films are damaged by sputtering.

The reason for selecting a gas field ionization ion source as an ion source in the present embodiment is that, since the ion source produces high brightness and the source size is small, it is easy to make an ion beam on the specimen minute and configure a microscope having a high resolution. In addition, since the electric current of the emitted ions is as small as several nA at most and ions turn into gas when neutralized, it is possible to make various kinds of damages done to the thin film 80 small.

A second feature of the present embodiment is in arranging an electrode 82 between the thin film 80 and the specimen. By handling the secondary electrons produced as a result of the thin film 80 appropriately, it is possible to avoid producing noise in the secondary electron observation image of the specimen. However, even if there is no such configuration and the secondary electrons are mixed in the image, substantially uniform background noise is reflected on the secondary electron image, and therefore observation of contrast that depends on the specimen can be performed sufficiently by applying suitable bias.

A third feature of the present embodiment is that front and back sides of the thin film 80 are kept in vacuum. Accordingly, it is possible to use thinner thin film for the thin film 80 since there is no need to support atmospheric pressure difference. Therefore, it is easier to increase the transmission factor of the ion beam 5. However, even if gas at or below atmospheric pressure is arranged at the specimen side of the thin film 80, there is no change in the essence of the present invention (the first feature described above).

Here, the thin film 80 is a silicon nitride thin film formed on a silicon substrate. The silicon substrate is etched in a shape of a window and a single silicon nitride thin film is placed in the window portion. The thin film is commercially available for holding specimens of transmission electron microscopes. Thickness of the silicon nitride thin film is 10 nm and the window size is 50 μm square. The thin film 80 is supported by a support body 81 having stainless characteristics and an electric potential thereof is controlled by the power source 83. Usually, silicon nitride thin films are insulators and electrification may cause problems. However, large electrification is not produced on the silicon nitride thin films since electron hole pairs are produced inside as a result of irradiation of the ion beam 5 and thus the silicon nitride thin films are electrically conductive. Here, broadening the irradiation range of the ion beam 5 onto the outside of the window is effective for reducing the electric potential difference caused by resistance. Such broadening may be done upon performing blanking of the ion beam 5.

An electric potential of the thin film 80 is made to be a ground potential, which is the same as the specimen 6, by the power source 83. If the thin film 80 is irradiated with the ion beam 5 by an acceleration voltage of 30 kV, the beam that has transmitted through the thin film 80 is neutralized to be an uncharged particle beam 50. The uncharged particle beam 50 hardly is scattered in the thin film 80, and thus applied to the same position on the specimen 6 to which the original ion beam 5 is converged and is deflected. Therefore, when an operation for acquiring a secondary electron observation image of the specimen 6 is caused to perform by the scanning ion microscope 200, it is possible to acquire an image at the same location. As compared with a case where there is no thin film 80, the amount of production of the secondary electrons 7 is reduced slightly, and in addition, the secondary electron observation image is not distorted when the specimen 6 is an insulator since the ion beam 5 is bent by the electrification of the specimen 6.

Here, since the ion beam 5 does not converge on the thin film 80, damage to the thin film 80 by the ion beam 5 is far smaller than damage to the specimen 6. Furthermore, in the present embodiment, the thin film 80 can move slightly by the thin film slight movement mechanism 800 (thin film moving means) (refer to FIG. 1). Thereby, the degradation can be delayed using the entire region of the thin film 80 uniformly.

In addition, the thin film slight movement mechanism 800 can remove the thin film 80 from the ion optical axis of the ion optical system 300. Thereby, larger secondary electron signals can be obtained when the specimen 6 is electrically-conductive.

Figure 2:
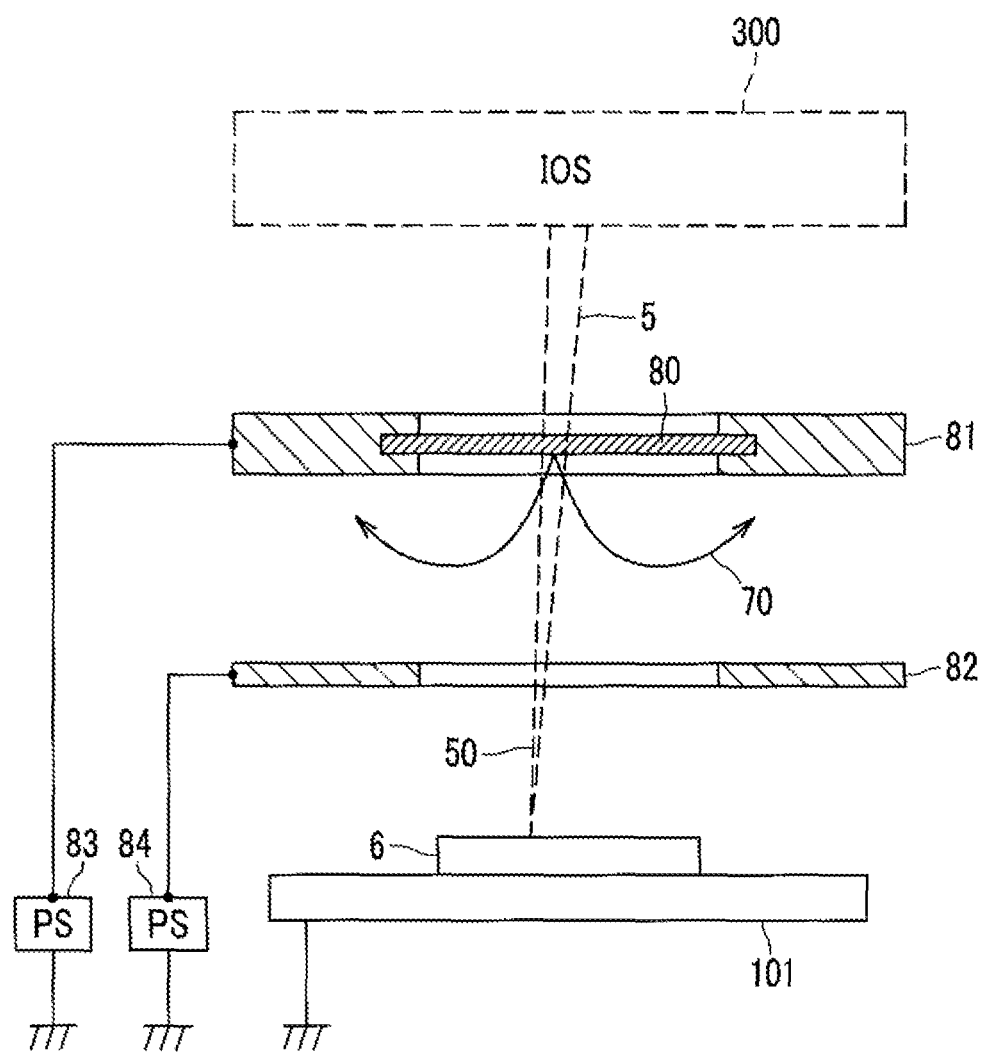
FIG. 2 shows a configuration around a thin film of the scanning ion microscope according to the first embodiment of the present invention.

FIG. 2 shows a configuration near a thin film of the scanning ion microscope according to the first embodiment of the present invention. The periphery of the thin film 80 will be described in detail using FIG. 2. When the thin film 80 is irradiated with the ion beam 5, the secondary electrons 70 transmit through the specimen 6 side of the thin film 80 in addition to the uncharged particle beam 50. When the secondary electrons 70 are mixed with the secondary electrons 7 produced at the specimen 6 and are detected by the secondary particle detector 104 (refer to FIG. 1), noise is mixed in the secondary electron observation image of the specimen 6. Accordingly, in the present embodiment, the electric potential of the electrode 82 having an opening in the center is set by the power source 84 appropriately. That is, the secondary electron 70 is sent back to the thin film 80 side by setting the electric potential of the electrode 82 to minus several tens of V with respect to the electric potential of the support body 81 (ground potential in this case). Thereby, noise in the secondary electron observation image of the specimen 6 can be removed. It should be noted that no matter how the electric potential of the electrode 82 is set, the path of the uncharged particle beam 50 is not affected.

Now, a method for improving convergence performance of the uncharged particle beam 50 by setting the electric potential of the thin film 80 will be described. In the above descriptions, the acceleration voltage of the ion beam 5 is 30 kV and the electric potential of the thin film 80 (i.e., electric potential of the support body 81) is a ground potential, which is the same as the specimen 6. Convergence performance of the uncharged particle beam 50 in this case is fundamentally the same as convergence performance of the ion beam 5.

Meanwhile, when the electric potential of the thin film 80 is set to a positive high potential, for example, 10 kV, by the power source 83, and the acceleration voltage of the ion beam 5 is set to 40 kV, which is a value higher for an amount corresponding to the positive high potential, it is possible to improve the convergence performance of the uncharged particle beam 50. By increasing the acceleration voltage of the ion beam 5 in this setting, the aberration of the ion optical system 300 becomes smaller, improving the convergence of the ion beam 5. The ion beam 5 slows down immediately before the specimen 6 by being affected from the thin film 80. This is because the lens effect in this part is small and thus the aberration thus produced is small also.

Meanwhile, the acceleration voltage (accelerating energy) of the uncharged particle beam 50 is incident energy of the ion beam 5 onto the thin film 80 ([acceleration voltage of the ion beam 5]−[electric potential of the thin film 80]) and is 30 kV. This is the same as the above-described case. Accordingly, with such setting, it is possible to improve convergence performance of the uncharged particle beam 50 by making incident energy of the uncharged particle beam 50 onto the specimen 6 the same. That is, it is possible to reduce aperture as compared to the same beam electric current.

<Second Embodiment>

Figure 3:
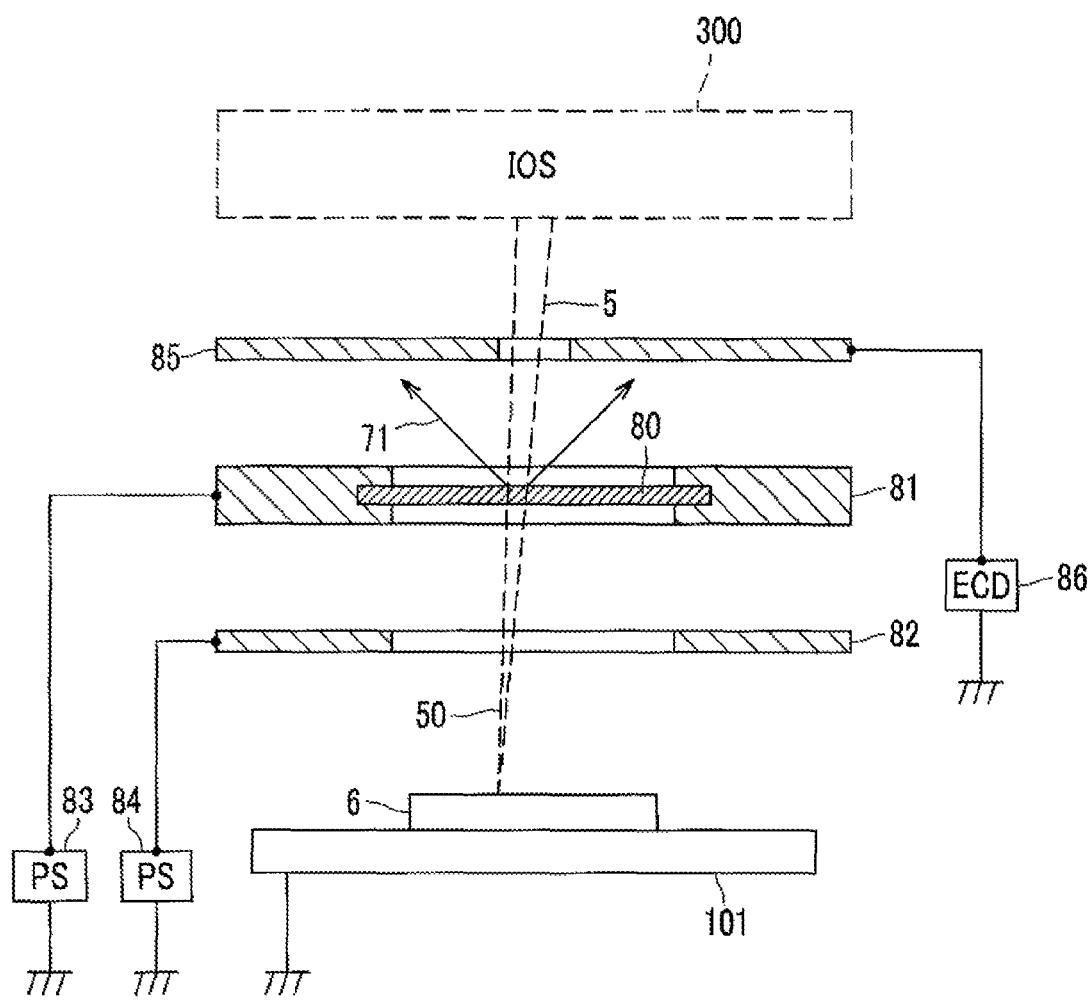
FIG. 3 shows a configuration around a thin film of a scanning ion microscope according to a second embodiment of the present invention.

FIG. 3 shows a configuration near a thin film of the scanning ion microscope according to a second embodiment of the present invention. The scanning ion microscope in the present embodiment is fundamentally the same as that in FIG.

1 but is different in that there are additional elements near the thin film 80. FIG. 3 shows a peripheral portion of the thin film 80.

If the thin film 80 is irradiated with the ion beam 5, a small amount of reflection particles and secondary electrons 71 are emitted to the side of the ion optical system 300. When they enter an electrostatic lens or a deflector in the ion optical system 300, the operation of the ion optical system 300 may become unstable as a result of inducement of unnecessary electrification onto the insulator portion. Accordingly, in the present embodiment, a shielding body 85 having an opening is arranged above the thin film 80 for blocking the reflection particles and secondary electrons 71. Although a part of the particles enter into the ion optical system 300, they do not directly enter insulators at least.

In addition, in the present embodiment, an electric current detector 86 is connected to the shielding body 85 and thus it is possible to monitor the electric current of the secondary electrons produced by the ion beam 5. When the amount of electric current flowing into the shielding body decreases largely even though there is irradiation of the ion beam 5, there is a possibility of abnormalities, such as when the thin film 80 is torn. In the scanning ion microscope in the present embodiment, the system is configured so as to at least alert the user by detecting abnormalities of the thin film 80 with the monitoring of the electric current. It should be noted that abnormalities, such as when the thin film 80 is torn, can be detected by monitoring the electric current flowing into the thin film 80 as well. Specifically, it is preferable if the power source 83 (means for controlling a first electric potential) detects abnormalities of the thin film 80 when the electric current flowing into the thin film 80 becomes a predetermined value or more by monitoring such electric current.

<Third Embodiment>

Figure 4:
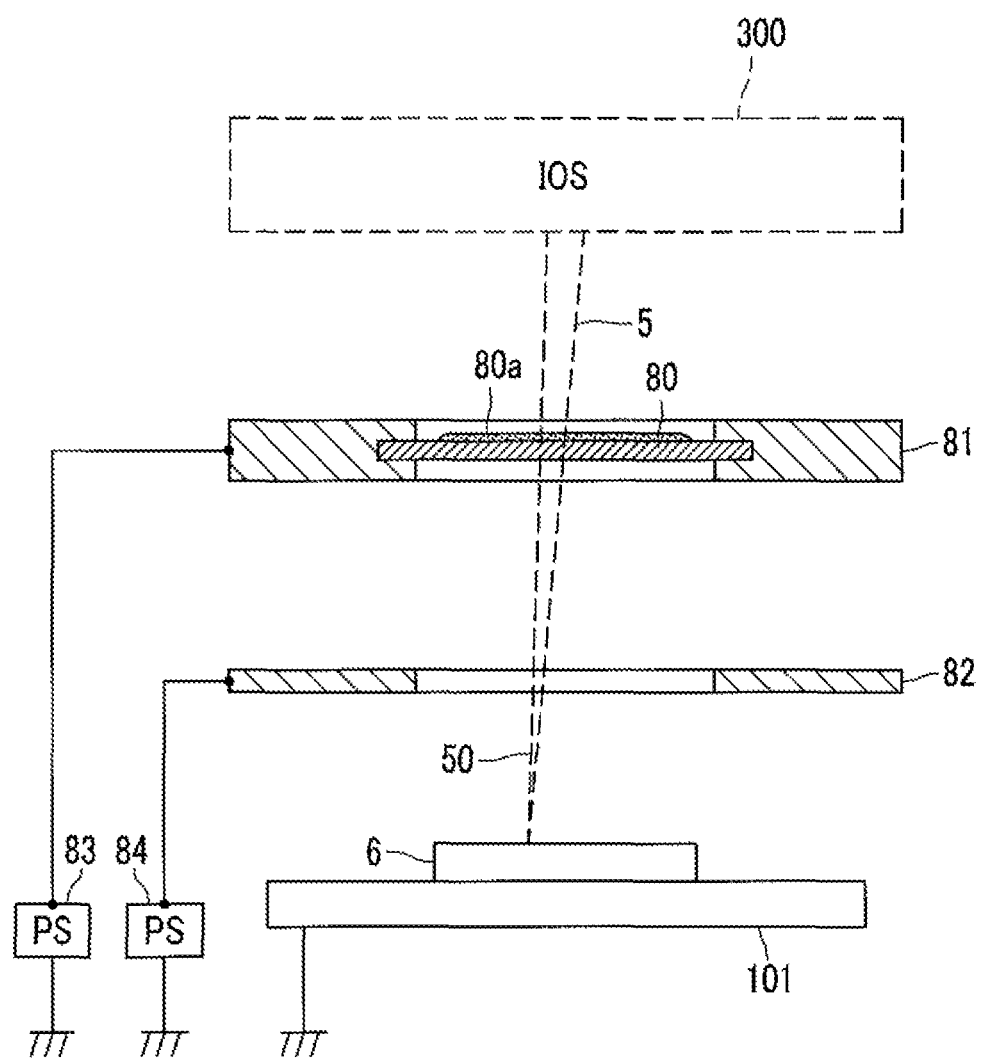
FIG. 4 shows a configuration around a thin film of a scanning ion microscope according to a third embodiment of the present invention.

FIG. 4 shows a configuration near a thin film of the scanning ion microscope according to a third embodiment of the present invention. The scanning ion microscope in the present embodiment is fundamentally the same as that shown in FIG. 1 but is different in that there are additional elements near the thin film 80. FIG. 4 shows a peripheral portion of the thin film 80. It has a feature of having a several-molecules layer of ionic liquid 80a dispersed on the silicon nitride thin film 80 similar to the first embodiment. Here, C10H15F6N3O4S2 ($C_{10}H_{15}F_6N_3O_4S_2$) (CAS No. 174899-83-3) is used for the ionic liquid 80a.

In the present embodiment, since the thin film 80 effectively becomes electrically-conductive as a result of the ionic liquid 80a, restrictions in selecting the material for the thin film 80 itself are freed. That is, the thin film 80 may be a complete insulator. Since the acceleration voltage of the ion beam 5 is low, it is effective even when the electrical conductivity emerging effect as a result of the irradiation is small.

In addition, in the present embodiment, the ionic liquid 80a solely is damaged by the ion beam 5 and is self-repaired as a result of the flow. Therefore, there is an advantageous effect of prolonging the lifetime of the thin film 80. It should be noted that the ionic liquid 80a shown here is good as long as it is electrically-conductive liquid and is not limited to the above-described composition.

<Fourth Embodiment>

Figure 5:
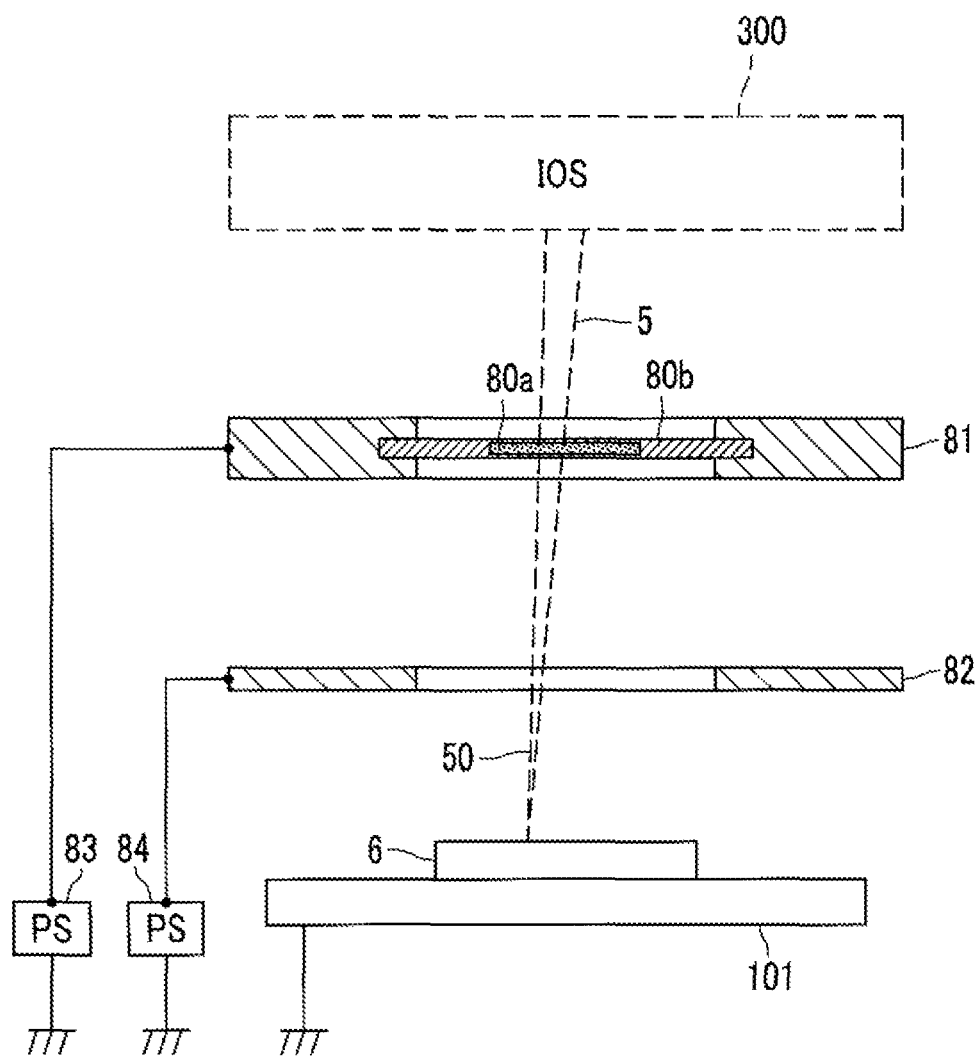
FIG. 5 shows a configuration around a thin film of a scanning ion microscope according to a fourth embodiment of the present invention.

FIG. 5 shows a configuration near a thin film of the scanning ion microscope according to the fourth embodiment of the present invention. The scanning ion microscope in the present embodiment is fundamentally the same as that shown in FIG. 1 but is different in the configuration of the thin film 80. FIG. 5 shows a peripheral portion of the thin film 80. In the present embodiment, the ionic liquid 80a is impregnated into a net-structured object 80b (mesh-structured object) made of carbon (thickness of several nm and average opening size of several μm), thus forming the thin film 80. The ionic liquid 80a is the same as that shown in the third embodiment.

From the ion beam 5, the thin film 80 can be viewed as a thin layer of ionic liquid. This is because there are only few ions scattering at carbon. Therefore, the thin film 80 is electrically-conductive and has self-repairing characteristics as a result of the ionic liquid 80a. The present embodiment also has an advantageous effect of prolonging the lifetime of the thin film 80.

<Fifth Embodiment>

Figure 6:
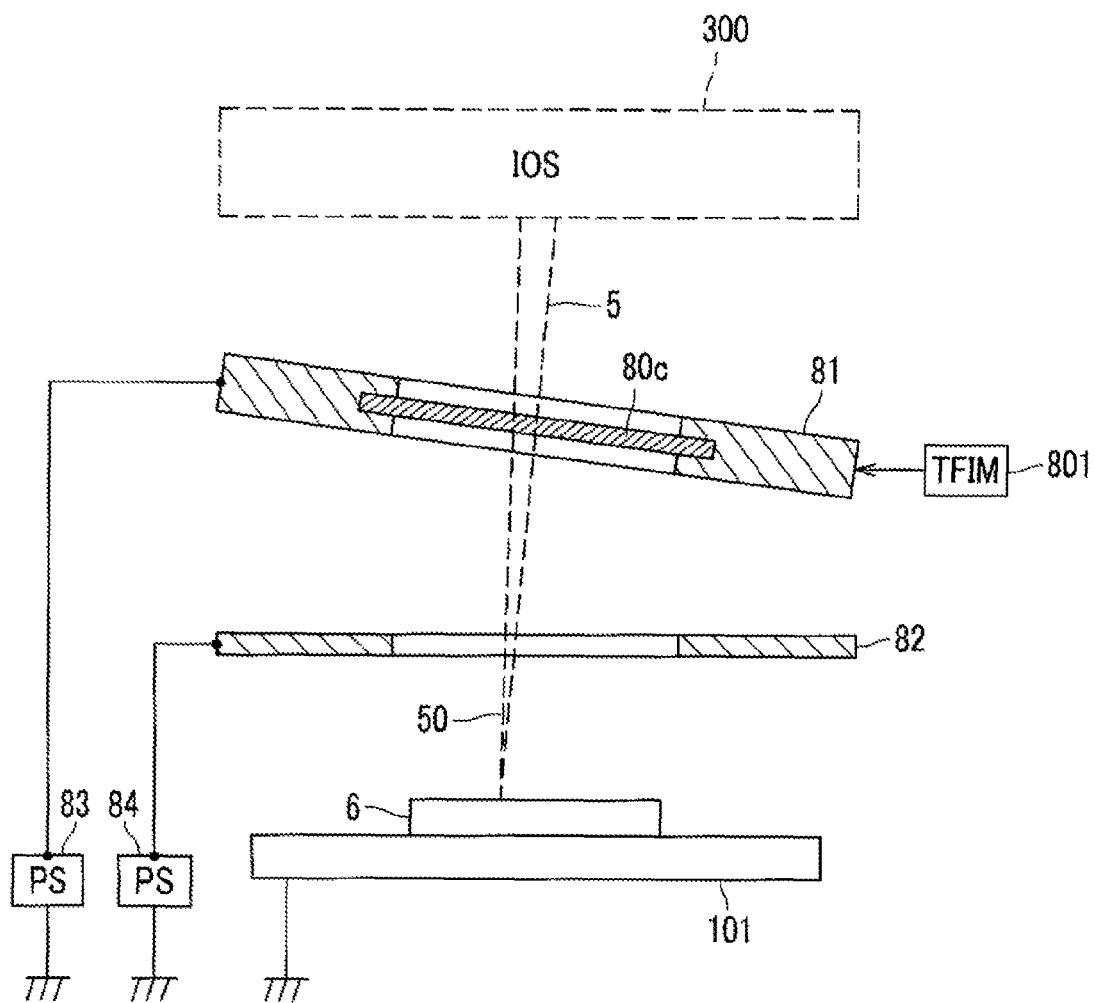
FIG. 6 shows a configuration around a thin film of a scanning ion microscope according to a fifth embodiment of the present invention.

FIG. 6 shows a configuration near a thin film of the scanning ion microscope according to the fifth embodiment of the present invention. The scanning ion microscope in the present embodiment is fundamentally the same as that shown in FIG. 1 but is different in the configuration of the thin film 80. FIG. 6 shows a peripheral portion of the thin film 80. In the present embodiment, a crystalline body 80c is used as the thin film 80. Specifically, the thin film 80 is formed by partially reducing the thickness of a single crystal silicon substrate by etching. In addition, there is provided a thin film inclining mechanism 801 so as to enable change in the incident angle of the ion beam 5 onto the thin film 80.

Here, there is a channeling phenomenon in the transmission of the ion beam through a crystalline body. That is, the channeling phenomenon is a phenomenon that the transmission capability of an ion beam entering in a specific crystal direction is high. The present embodiment adjusts such that the transmission capability of the ion beam 5 is the highest by inclining the crystalline body 80c as appropriate by the thin film inclining mechanism 801. Thereby, it is possible to prevent excessive scattered particles from existing above the thin film 80. It should be noted that, when the thin film 80 is constituted by microcrystals, similar effect can be obtained with channeling if the directions of the microcrystals are aligned.

<Sixth Embodiment>

Figure 7:
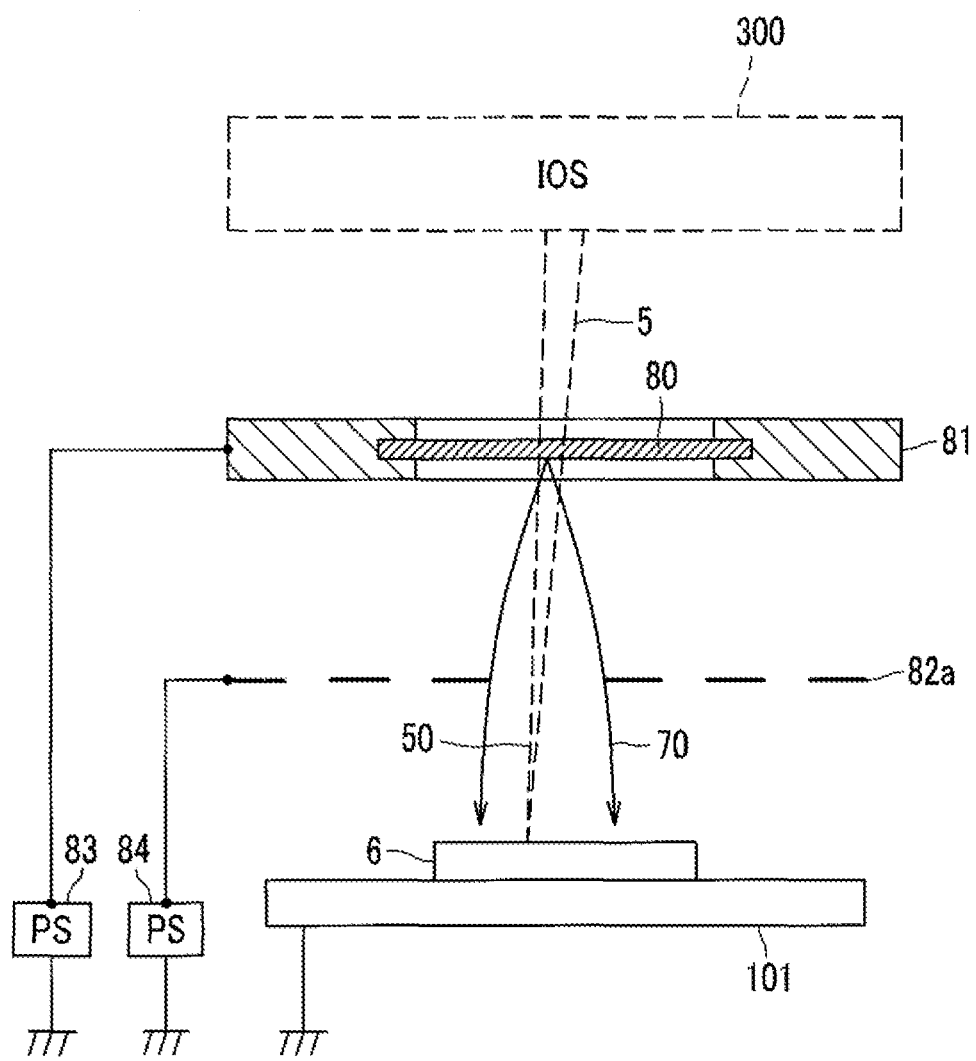
FIG. 7 shows a configuration around a thin film of a scanning ion microscope according to a sixth embodiment of the present invention.

FIG. 7 shows a configuration near a thin film of the scanning ion microscope according to the sixth embodiment of the present invention. The scanning ion microscope in the present embodiment is fundamentally the same as that shown in FIG. 1 but is different in portions near the thin film 80. The portions near the thin film 80 are shown in FIG. 7. In the present embodiment, the electrode 82 is replaced with a mesh-structured electrode 82a. Both the electrode 82 and the mesh-structured electrode 82a have a common feature of having an opening in the center portion of the transmission of the uncharged particle beam 50. The electric potential of the thin film 80 is set to −100V with respect to the specimen 6 by the power source 83. In addition, the electric potential of the mesh-structured electrode 82a is set by the power source 84 to a ground potential, which is the same as the specimen 6. By such electric potential setting, the secondary electron 70 produced at the thin film 80 is accelerated with 100 V to be irradiated to the specimen 6. By irradiating the secondary electrons 70 onto the specimen 6, it is possible to neutralize electrification on the surface if the specimen 6 is an insulator.

It should be noted that energy and the direction are completely different between such secondary electrons 70 and the secondary electrons 7 produced at the specimen 6 in an equipotential space surrounded by the specimen 6 and the mesh-structured electrode 82a. For this reason, it is easy to detect only the secondary electron 7 selectively with an electric field produced at an end of the secondary particle detector 104, and thus it is possible to achieve both the electrification neutralization and the specimen image formation. Of course, it is also possible to perform intermittently irradiation of the secondary electron 70 onto the specimen 6 by controlling the mesh electrode 82a. Even if the electric potential of the mesh-structured electrode 82a is controlled, there is no influence on the path of the uncharged particle beam 50. In addition, even if the electrode 82 is not a mesh-structured electrode, it is possible to obtain the same effect as the above. However, in this case, the irradiation amount of the secondary electron 70 onto the specimen 6 is reduced slightly.

It should be noted that although the electric potential of the thin film 80 is negative in the present embodiment, it is good as long as the electric potential is relatively negative as compared to the electric potential of the specimen 6. For example, it is possible to achieve a similar advantageous effect when the thin film 80 has a ground potential and the specimen has a positive electric potential. This case has an advantage that the accelerating energy of the ion beam 5, that is, the accelerating energy of the uncharged particle beam 50, can be made constant.

That is, it is preferable to accelerate secondary electrons emitted from the thin film 80 with several tens of V to several hundred V and inject them into the specimen 6 by maintaining a first electric potential, which is an electric potential of the support body 81 with respect to the electric potential of the specimen 6, to negative relatively, and maintaining a second electric potential, which is an electric potential of the electrode 82 with respect to the first electric potential, to positive relatively.

<Seventh Embodiment>

Figure 8:
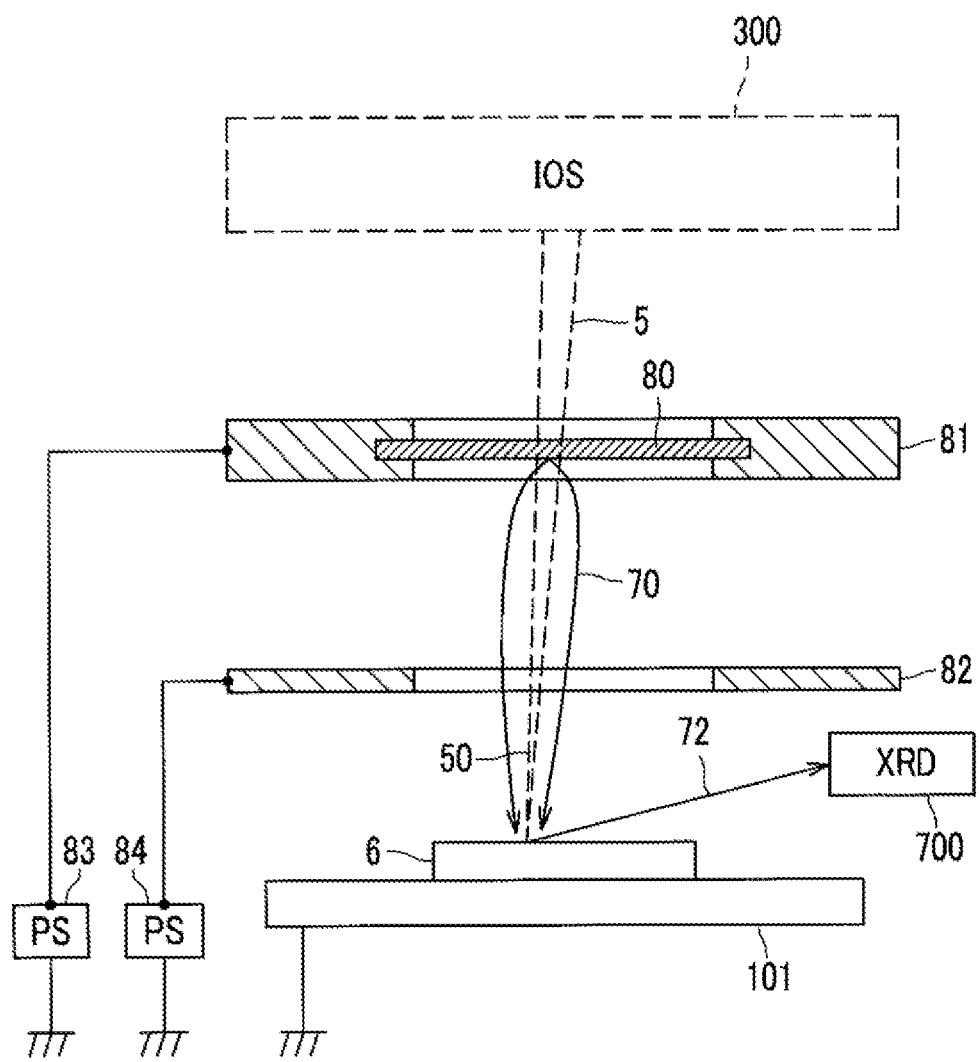
FIG. 8 shows a configuration around a thin film of a scanning ion microscope according to a seventh embodiment of the present invention.

FIG. 8 shows a configuration near a thin film of the scanning ion microscope according to the seventh embodiment of the present invention. The scanning ion microscope in the present embodiment is fundamentally the same as that shown in FIG. 1 but is different in that there are additional elements near the thin film 80. The portions near the thin film 80 are shown in FIG. 8. In the present embodiment, there is provided an X ray detector 700 for detecting X rays 72 that come from the specimen 6. The X ray detector 700 can conduct energy analysis of the X ray and can form a specimen image instead of secondary electron signals from the specimen 6 by outputting a part of the energy distribution as X ray intensity signals.

The X rays 72 are emitted from the specimen 6 according to the following setting in the present embodiment. That is, an electric potential of the thin film 80 is set to −10 kV with respect to the specimen 6 by the power source 83. The electric potential of the electrode 82 is set by the power source 84 between an electric potential of the thin film 80 and a ground potential which is the electric potential of the specimen 6. According to such electric potential setting, the secondary electron 70 produced in the thin film 80 is accelerated with 10 kV to irradiate the specimen 6. A characteristic X ray which depends on the material of the specimen 6 is emitted as a result of the secondary electron 70 that is accelerated with several kV or more irradiating the specimen 6. Scanning by the secondary electrons 70 is performed interlockingly as scanning by the ion beam 5 is performed by the ion optical system 300. Accordingly, the configuration and setting in the present embodiment are equivalent to configuring an X ray analysis microscope that uses electron beams as a probe. Thus, there are advantageous effects of not only the specimen 6 being minutely observable by the neutral beam but also the material analysis being able to perform easily.

It should be noted that although the electric potential of the thin film 80 is negative in the present embodiment, there is a need to only be relatively negative with respect to the electric potential of the specimen 6. For example, it is possible to obtain similar effects when the thin film 80 has a ground potential and the specimen has a positive electric potential. In this case, there is an advantage that the accelerating energy of the ion beam 5, that is, the accelerating energy of the uncharged particle beam 50, can be made constant.

That is, at least one of the secondary particle detectors 104 is an X ray detector 700 for X rays emitted from the specimen 6. It is preferable if the first electric potential, which is an electric potential of the support body 81 with respect to the electric potential of the specimen 6, is maintained relatively negative, and the second electric potential, which is an electric potential of the electrode 82 with respect to the first electric potential, is maintained relatively positive, and thus the secondary electrons emitted from the thin film 6 are accelerated with several kV to several tens of kV to be injected into the specimen such that the X rays emitted from the specimen are detected.

Here, if no special consideration takes place, the spread of the secondary electrons 70 on the specimen 6 is broad, resulting in low resolution of the secondary electrons 70. Accordingly, in the present embodiment, the diameter of the opening and the electric potential setting of the electrode 82 are devised to have electrostatic lens functionality for the secondary electrons 70. Thereby, the probe system of the electron beam on the specimen 6 can be made small to some extent. Specifically, resolution of the uncharged particle beam 50 is about 1 nm and resolution of the electron beam is about 1 μm. It should be noted that although the scanning range of the electron beam on the specimen 6 corresponds to the scanning range of the uncharged particle beam 50, the size is different. Accordingly, the scanning ion microscope in the present embodiment has functionality to perform magnification correction when comparing both specimen images.

Although the present embodiment uses electrostatic lens functionality for converging the electron beams, the convergence performance of the electron beam can also be improved more using magnetic field utilizing lens functionality. Neither of the cases affects the path of the uncharged particle beam 50 at all.

It should be noted that the thin film 80 of the present invention is not limited to the above-described material and is preferably made of thin material that shows electrical conductivity at least by ion irradiation and is easily transmitted by ion beams. For example, thin films of carbon and metal, and a monomolecular film of electrically-conductive polymer may be used.

As described above, according to the scanning ion microscope in the present embodiment, the specimen image is formed by scanning with uncharged particles, and therefore it is possible to observe a specimen containing an insulator without distortion. In addition, since irradiation of electrons emitted from the thin film can be controlled, it is possible to prevent noise contamination in the specimen image. Furthermore, it is possible to prevent electrification of the specimen and perform analysis by making X rays emit from the specimen.

DESCRIPTION OF REFERENCE NUMERALS

1: emitter tip
2: extraction electrode
3: gas outlet portion of gas supply piping
4: extraction voltage application unit (EVA)
5: ion beam
6: specimen
7: secondary electron
50: uncharged particle beam
70: secondary electron 71: reflection particle and secondary electron
72: X ray
80: thin film
80*a*: ionic liquid
80*b*: net-structured object (mesh-structured object)
80*c*: crystalline body
81: support body (support member)
82: electrode
82*a*: mesh-structured electrode
83, 84: power source (PS)
85: shielding body
86: electric current detector (ECD)
100: gas field ionization ion source (GFIS)
101: specimen stage
102: lens system (lens series system)
102*a*, 102*b*: electrostatic lens
102*c*: beam limiting aperture
102*d*: aligner
103: deflector system (deflector series system)
103*a*, 103*b*: deflector
104: secondary particle detector (SPD)
105: lens system controller (LSC)
106: deflector system controller (DSC)
110: image processing unit (IPU)
110*a*: storage unit (SU)
110*b*: display unit (DP)
120: ion controller (ICNT)
200: scanning ion microscope
300: ion optical system (ion optical series system, ISO)
700: X ray detector (XRD)
800: thin film slight movement mechanism (thin film moving means)
801: thin film inclining mechanism (TFIM)

The invention claimed is:

1. A scanning ion microscope comprising:
   an ion source;
   a specimen stage configured to hold a specimen;
   an ion optical system configured to cause ions emitted from the ion source converge on the specimen and make deflection of the converged ions to a given position on the specimen;
   an ion controller configured to control the ion optical system;
   a secondary particle detector configured to detect a secondary particle emitted from the specimen; and
   an image processing unit configured to form an image in which by a signal from the secondary particle detector corresponds to the deflection of the converged ions, and store the image in a storage unit and displays the image on a display unit; wherein the scanning ion microscope further comprises:
   a support member, which is electrically-conductive, configured to support a thin film which is irradiated with the ions, is disposed between the ion optical system and the specimen;
   a potential control unit configured to control a first electric potential, which is an electric potential of the support member; and
   an electrode potential control unit configured to control a second electric potential, which is an electric potential of an electrode that is disposed between the thin film and the specimen, the electrode having an opening therein; and
   wherein secondary electrons emitted from the thin film are prevented from entering the secondary particle detector by maintaining the second electric potential relatively negative with respect to the first electric potential.

2. The scanning ion microscope according to claim 1, wherein
   the thin film has electrical-conductivity at least when the thin film is irradiated with the ions.

3. The scanning ion microscope according to claim 1, wherein
   the scanning ion microscope further comprises a thin film moving unit configured to move the thin film with respect to an optical axis of the ion optical system.

4. The scanning ion microscope according to claim 1, further comprising means for shielding mechanically or by electromagnetic field at least a part of secondary particles emitted from the thin film on a side opposite to the specimen across the thin film.

5. The scanning ion microscope according to claim 1, wherein
   ionic liquid is coated on the thin film.

6. The scanning ion microscope according to claim 1, wherein
   the thin film comprises a mesh-structured object.

7. The scanning ion microscope according to claim 1, wherein
   the thin film comprises a crystalline body and the scanning ion microscope further comprises a means for inclining the thin film with respect to an axis of the ion optical system.

8. The scanning ion microscope according to claim 1, wherein
   energy of uncharged particles emitted from the thin film is reduced by maintaining the first electric potential relatively positive with respect to the electric potential of the specimen.

9. The scanning ion microscope according to claim 4, wherein
   an electric current detector is connected to the means for shielding, and
   the electric current detector monitors electric current of secondary electrons emitted from the thin film and detects an abnormality of the thin film when the electric current is smaller than or equal to a predetermined value.

10. The scanning ion microscope according to claim 1, wherein
    the potential control unit monitors an electric current flowing into the thin film and detects an abnormality of the thin film when the electric current is greater than or equal to a predetermined value.

11. The scanning ion microscope according to claim 3, wherein
    the thin film moving unit makes a retreat of the thin film from an optical axis of the ion optical system.

12. A secondary particle control method using a scanning ion microscope including:
    an ion source;
    a specimen stage configured to hold a specimen;
    an ion optical system configured to cause ions emitted from the ion source converge on the specimen and make deflection of the converged ions to a given position on the specimen;
    an ion controller configured to control the ion optical system;
    a secondary particle detector configured to detect a secondary particle emitted from the specimen; and
    an image processing unit configured to form an image in which by a signal from the secondary particle detector corresponds to the deflection of the converged ions, and store the image in a storage unit and displays the image on a display unit; wherein the scanning ion microscope further comprises:
a support member, which is electrically-conductive, configured to support a thin film which is irradiated with the ions, is disposed between the ion optical system and the specimen;
a first potential control unit configured to control a first electric potential, which is an electric potential of the support member; and
a second potential control unit configured to control a second electric potential, which is an electric potential of an electrode that is disposed between the thin film and the specimen, the electrode having an opening therein,
the method comprising preventing secondary electrons emitted from the thin film from entering into the secondary particle detector by maintaining the second electric potential relatively negative with respect to the first electric potential.

* * * * *